US008351213B2

(12) United States Patent
Gorrell et al.

(10) Patent No.: US 8,351,213 B2
(45) Date of Patent: Jan. 8, 2013

(54) ELECTRICAL ASSEMBLY

(76) Inventors: Brian Gorrell, Angola, IN (US); Austin A. Saylor, Sylvania, OH (US)

(*) Notice: Subject to any disclaimer, the term of this patent is extended or adjusted under 35 U.S.C. 154(b) by 695 days.

(21) Appl. No.: 11/749,480

(22) Filed: May 16, 2007

(65) Prior Publication Data

US 2007/0272433 A1 Nov. 29, 2007

Related U.S. Application Data

(60) Provisional application No. 60/808,763, filed on May 26, 2006.

(51) Int. Cl.
H05K 1/18 (2006.01)

(52) U.S. Cl. ........ 361/761; 361/762; 361/764; 361/743; 361/760

(58) Field of Classification Search .............. 361/761, 361/764, 743, 762
See application file for complete search history.

(56) References Cited

U.S. PATENT DOCUMENTS

| 3,191,100 | A | * | 6/1965 | Sorvillo | 361/778 |
| 3,710,196 | A | * | 1/1973 | Fifield | 361/779 |
| 5,886,886 | A | * | 3/1999 | Teng | 363/59 |
| 6,487,083 | B1 | * | 11/2002 | Kwong | 361/761 |
| 6,509,637 | B1 | | 1/2003 | Liebhard | |
| 6,529,385 | B1 | * | 3/2003 | Brady et al. | 361/766 |
| 2003/0151138 | A1 | * | 8/2003 | Breu et al. | 257/724 |
| 2004/0194993 | A1 | | 10/2004 | Aoyagi | |

FOREIGN PATENT DOCUMENTS

| DE | 10111683 | 11/2002 |
| JP | 2004048905 | 2/2004 |

OTHER PUBLICATIONS

"Investigation of a laser soldering process for the interconnection of thin film sensors with sputtered multilayer metallizations", Journal of Vacuum Science & Technology A: Vacuum, Surfaces and Films, vol. 11, Issue: 4, Jul. 1993, pp. 14641469 (6 pages).
Canadian Official Action for Canadian Application No. 2,650,108 dated Jul. 18, 2011 (5 pages).

* cited by examiner

Primary Examiner — Tuan T Dinh
Assistant Examiner — Steven Sawyer
(74) Attorney, Agent, or Firm — Taylor IP, P.C.

(57) ABSTRACT

An electrical assembly including a substantially planar substrate having at least one recess therein and a plurality of electrical components. The electrical components are positioned in the at least one recess and include a first electrical component and a second electrical component. Each of the electrical components has a body and an electrical connection. The electrical connection of the first electrical component and the electrical connection of the second electrical component are aligned with each other when the body of the first electrical component is in a recess and the body of the second electrical component is in a recess.

7 Claims, 2 Drawing Sheets

ELECTRICAL ASSEMBLY

CROSS-REFERENCE TO RELATED APPLICATIONS

The present regular United States Patent Application claims the benefits of U.S. Provisional Application Ser. No. 60/808,763; filed on May 26, 2006.

FIELD OF THE INVENTION

The present invention relates to an electrical assembly, and, more particularly to an electrical assembly on a modified substrate.

BACKGROUND OF THE INVENTION

It is known in the art to print thick film conductive inks on a substrate and cure the inks to produce an electrical circuit assembly. Various resistivities of the conductive ink are used and additional electrical components may be attached to the substrate to manufacture the electrical circuit. Polymer thick film circuits may be manufactured using a polyester dielectric substrate and screen printed thick film conductive inks. High speed screen printing techniques can be used, and multi-layer circuits may be manufactured utilizing dielectric materials as insulating layers. Both active and passive surface mount components can be added to the substrate. The substrate with the mounted components can be encapsulated to shield the assembly from the effects of moisture.

Alumina ($Al_2O_3$) is often utilized as a ceramic substrate for the printing of thick film circuits thereon. Passive and active components can be mounted to conductive pads screen printed on the substrate. The alumina substrate is typically a planar rectangular shaped substrate. Alumina is a widely used material due to availability, relatively low cost and stable physical properties. It is relatively easy to fabricate and retains its strength at high temperatures.

Alumina can be manufactured in thicknesses from 0.5 mm up to 12.5 mm. The power density in watts/$cm^2$ for alumina is approximately 23.25 W/$cm^2$. Alumina also has a relatively high dielectric strength of $2.39 \times 10^5$ V/in and an electrical resistivity of $3.28 \times 10^{13}$ Ohms ft.

It is known to encapsulate or contain high voltage circuits in an enclosure filled with oil having a high dielectric and breakdown characteristic, to allow the proximity of high voltage components in the assembly. High voltage circuits can be pre-positioned by way of a printed circuit board or point-to-point wiring, and the completed assembly encapsulated to allow safe installation into another assembly.

Current known methods of assembling electrical circuit components involve the connection of leads of the electrical component to an intermediate structure, such as a solder post or a solder pad of a printed circuit board. The lead of the electrical component typically is formed so that it can be inserted into a hole in the printed circuit board, and the lead then soldered to a pre-tinned pad on the circuit board. If the lead is to be connected to a solder post, the lead is bent around the post and then soldered thereto. Solder posts typically have leads of other components or wires soldered thereto.

Although rarely known to be done in production electrical assemblies, leads of electrical components can be directly soldered together without the support of a solder post or a printed circuit board. Typically the leads are twisted together by hand, and solder is applied to the twisted leads to ensure the electrical connection.

Leadless electrical components are placed on surface mount circuit boards and are held in place with a small amount of adhesive. The ends of the leadless components are then soldered to pads on the circuit board, which provides mechanical support and electrical connections for the leadless component.

Each of the known methods described above requires a mechanical attachment of either the leads or the component prior to soldering.

What is needed in the art is an assembly method that results in pre-positioned electrical components without the use of an attachment procedure.

SUMMARY OF THE INVENTION

The present invention provides a modified substrate for the assembly of an electrical circuit.

The invention comprises, in one form thereof, an electrical assembly including a substantially planar substrate having at least one recess therein and a plurality of electrical components. The electrical components are positioned in the recesses and include a first electrical component and a second electrical component. Each of the electrical components has a body and an electrical connection. The electrical connection of the first electrical component and the electrical connection of the second electrical component are aligned with each other when the body of the first electrical component is in a recess and the body of the second electrical component is in a recess.

The invention comprises, in another form thereof, an electrical assembly including a substrate having a plurality of shaped recesses therein and a plurality of electrical components. The electrical components have external characteristics that are accommodated by being placed into a corresponding one of the plurality of shaped recesses. Each electrical component of the plurality of electrical components has an electrical connection that is aligned by the shaped recesses to be in contact with an electrical connection of at least one other electrical component of the plurality of electrical components.

The invention comprises, in yet another form thereof, a method of constructing an electrical circuit including the steps of providing a substrate and forming a plurality of grooves in the substrate, aligning electrical connections of a plurality of electrical components in the plurality of grooves, electrically connecting the plurality of electrical components in the grooves, and coating the substrate and the plurality of electrical components with an insulative coating.

An advantage of the present invention is that it positions electrical components in recesses, thereby positioning the leads and/or electrical connections so that they can be electrically connected.

Another advantage of the present invention is that the electrical components are separated by a high dielectric coefficient material prior to the encapsulation of the circuit.

Yet another advantage of the present invention is that it can interface with thick film printed circuitry on the substrate.

Still another advantage of the present invention is that it is coated with an insulating compound, which is compatible with the alumina substrate and the components positioned therein.

Other features and advantages of the invention will become apparent to those skilled in the art upon review of the following detailed description, claims and drawings in which like numerals are used to designate like features.

Figure 1:
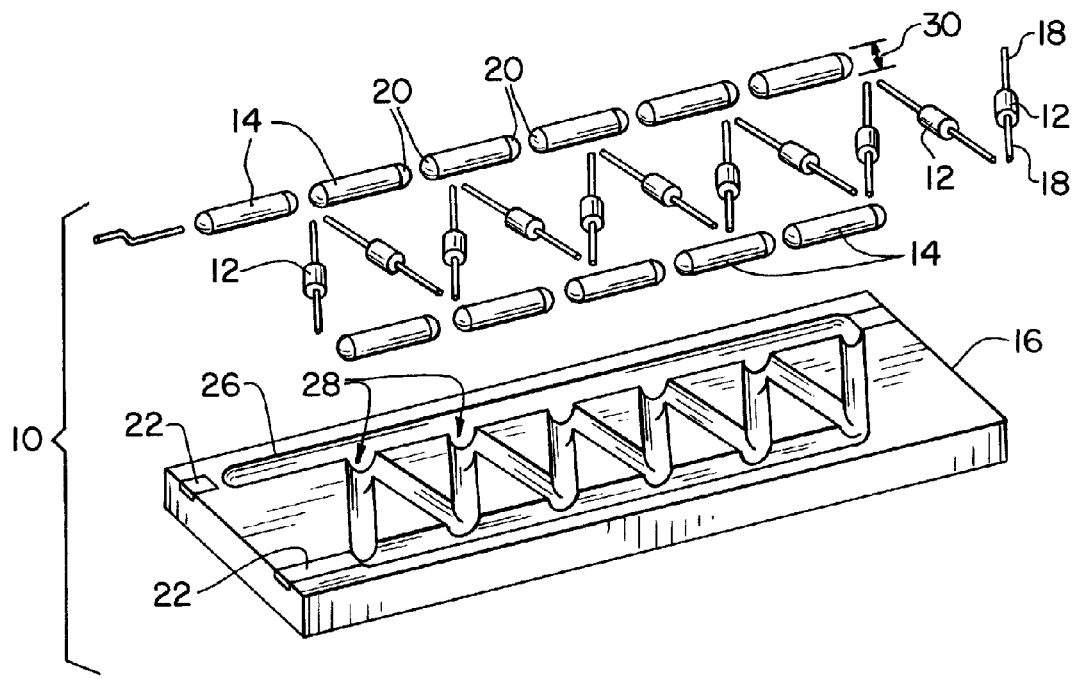
FIG. 1 is a perspective, exploded view of an embodiment of an electrical circuit of the present invention.

Before the embodiments of the invention are explained in detail, it is to be understood that the invention is not limited in its application to the details of construction and the arrangements of the components set forth in the following description or illustrated in the drawings. The invention is capable of other embodiments and of being practiced or being carried out in various ways. Also, it is understood that the phraseology and terminology used herein are for the purpose of description and should not be regarded as limiting. The use herein of "including", "comprising" and variations thereof is meant to encompass the items listed thereafter and equivalents thereof, as well as additional items and equivalents thereof.

DETAILED DESCRIPTION OF THE PREFERRED EMBODIMENT

Figure 2:
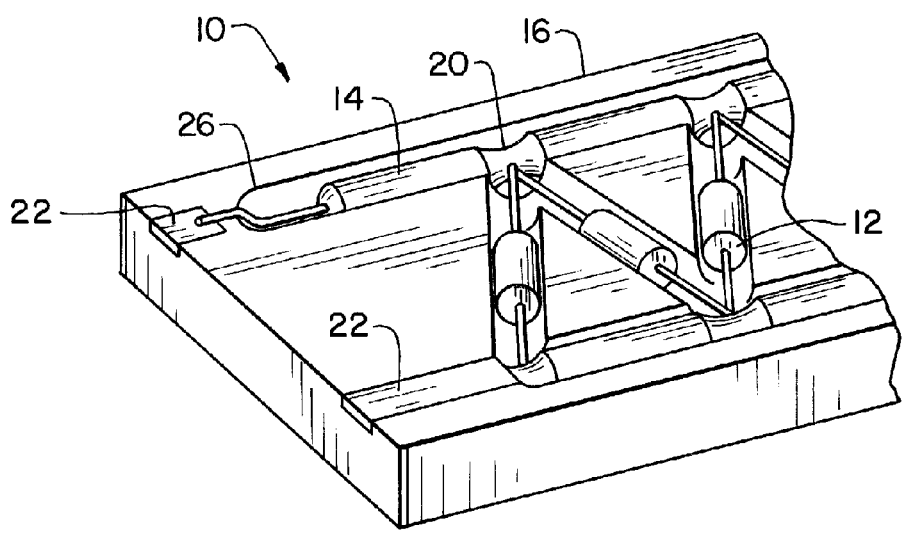
FIG. 2 is a partial view showing detail of circuit elements of the electrical circuit of FIG. 1.
Figure 3:
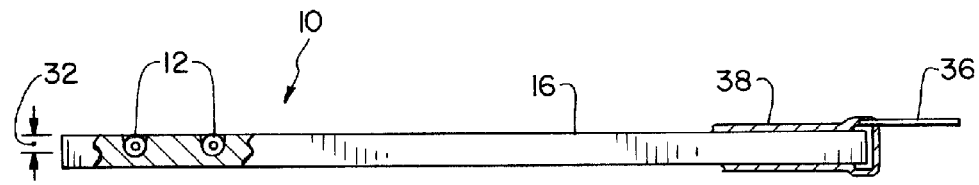
FIG. 3 is a partially sectioned side view showing components of the electrical circuits of FIGS. 1 and 2 placed in recesses of the substrate of FIGS. 1 and 2, and also illustrating an external conductor.

Referring now to the drawings, and more particularly to FIGS. 1-3 there is shown an electrical assembly 10 including a first component 12 and a second component 14 that are assembled upon a substrate 16. Components 12 and 14 may be a diode 12 and a capacitor 14 that are a part of a voltage multiplying circuit having several stages of multiplication and with numerous substantially similar components 12 and 14. Although components 12 and 14, for the purposes of clarity, are described as diodes 12 and capacitors 14 other electrical components can be utilized in the method of the present invention, including active components or unpackaged components.

Diodes 12 have leads 18 extending therefrom. Diodes 12 have a substantially cylindrical body from which leads 18 protrude. Leads 18 provide electrical connections to diode 12.

Capacitors 14 have bodies with balls of solder 20 positioned on each end, which are electrical connections to capacitor 14. Conductive paths 22 and resistive paths 24 may be printed and fired, using known thick film construction techniques, upon substrate 16 prior to the assembly of diodes 12 and capacitors 14 therein.

Substrate 16 may be made of alumina, which is highly resistive electrically and has a high electrical breakdown characteristic. Alumina ($Al_2O_3$) is a widely used material due to availability, relatively low cost and stable physical properties. It is relatively easy to fabricate and retains its strength at high temperatures. Alumina can be manufactured and molded in a variety of forms and thicknesses. The power density in watts/cm$^2$ for alumina is approximately 23.25 W/cm$^2$. Alumina also has a relatively high dielectric strength of $2.39 \times 10^5$ V/in and an electrical resistivity of $3.28 \times 10^{13}$ Ohms ft. These characteristics and advantages of alumina make it suitable for use in the present invention. The alumina substrate 16 conducts heat readily and thus serves as a heat sink for the components mounted therein and thereon. The alumina substrate 16 also serves to isolate electric fields and can be thought of as a field dispersing material. However, materials other than alumina also may be used in the present invention for substrate 16.

Substrate 16 includes multiple recesses 26, also known and referred to as grooves 26. Recesses or grooves 26 meet at intersection points 28. Recesses 26 may be formed in substrate 16 by a variety of processes, such as abrading, machining, etching and laser techniques. Alternatively, recesses 26 may be formed in a molding process of substrate 16. Recesses 26 may have a semi-cylindrical bottom to accommodate substantially cylindrical components that are placed therein. Recesses 26 have a depth 32 that is commensurate with a width 30 of the components. In the exemplary embodiment, depth 32 is equal to or greater than width 30 so that components 12 and 14 are at or below the top planar surface of substrate 16. Recesses 26 are geometrically configured so that the center lines coincide at intersections 28, thereby allowing an ease of construction of electrical assembly 10. Leads 18 of diode 12 may be stacked at intersecting points 28 so that balls of solder 20 can be heated, for example by way of a laser, causing adjacent balls of solder 20 to merge and bond leads 18 to adjacent capacitors 14 at intersections 28. In one advantageous form of the invention, recesses 26 position components 12 and 14 so that the electrical connection, by way of a soldering technique, may be undertaken without any holding fixture and without any adhesive to hold components 12 and 14 in position. The material between recesses 26 allow for the construction of a high voltage circuit that substantially separates components within the circuit by virtue of components 12 and 14 being placed in recesses 26.

Although recesses 26 are illustrated as having substantially parallel walls with semi-cylindrical bottoms, other geometries are also contemplated. For example, shapes can be used that correspond to the exterior profiles of the electrical components. Also, the shape does not have to be uniform along recesses 26. For example, along the axial length of a diode 12 the bottom of recess 26 can rise away from the body of diode 12 in the area of leads 18. Recesses 26 position components 12 and 14 for the electrical interconnection of leads 18 with solder 20. Substrate 16 not only positions components 12 and 14, but also provides an electrical isolation function by separating the components with a high dielectric material. Substrate 16 provides a robust skeletal structure for the components placed therein. By making the assembly in this manner, as a self-contained module, advantageously leads to confirmed quality by reducing contamination and integrity issues that occurred in the prior art methods.

Figure 4:
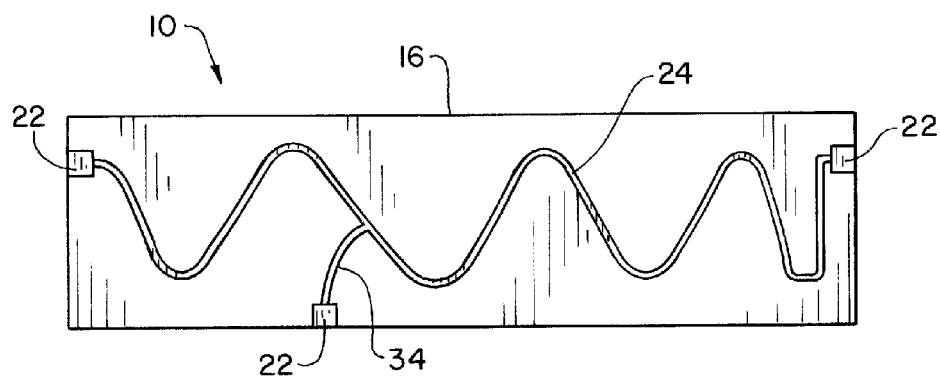
FIG. 4 is a view of a reverse side of the substrate illustrated in FIGS. 1-3.

Additionally referring to FIG. 4, there is shown a feedback resistive network that is printed on the reverse side of substrate 16 including a resistive path 24 and a resistive branch path 34. The circuit illustrated on the obverse side of substrate 16 is a voltage multiplier circuit and the high voltage output can be feed back through resistive paths 24 and 34 for purposes of monitoring and controlling the voltage output. Lead 36 is omitted in FIG. 4 to show substrate 16 in its unassembled state such as in FIG. 1. Conductive pads 22 are electrically connected to resistive paths 24 and 34 and are formed using thick film circuit methods that print inks on substrate 16. The inks, which may include ruthenium, are fired to bond the films to substrate 16 and to stabilize the electrical characteristics of the films. This process is completed prior to components 12 and 14 being placed in substrate 16. A conductive pad 22 can be placed on both sides of substrate 16 so that lead 36 can provide an electrical connection from one conductive pad 22 on one side of substrate 16 to the pad on the opposite side of substrate 16. Lead 36 is a conductor that extends beyond coating 38 to provide an electrical connection to other circuit elements, not shown. Lead 36 may have a C-shaped portion to provide a solderable connection on both sides of substrate 16.

Additional circuit components, such as leadless capacitors, resistors, transistors and integrated circuits, none of which are illustrated, can be positioned by methods utilizing thick film circuitry techniques on the reverse planar side of substrate 16. Leads 36 are attached to portions of substrate 16 and extend beyond substrate 16 to allow for electrical connections after coating 38 is applied to substrate 16.

Figure 5:
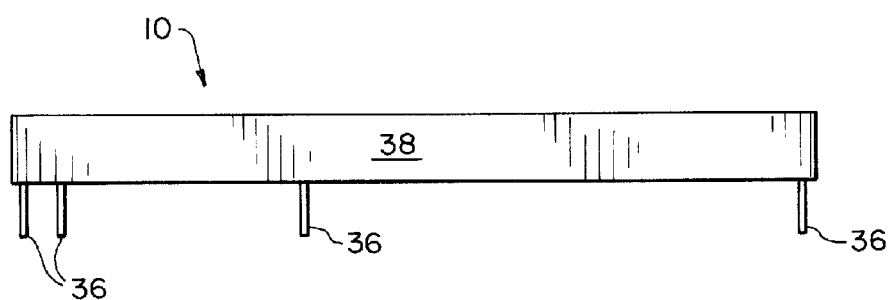
FIG. 5 is a view of another embodiment of the present invention illustrating an encapsulated substrate with leads extending therefrom.

Now, additionally referring to FIG. 5, there is shown another embodiment of the present invention being configured with four leads 36 extending from one side of electrical assembly 10. Insulating coating 38 is applied as an outer coating of electrical assembly 10, which bonds well and provides a high electrical insulative property to circuit assembly 10. Insulating coating 38 in combination with the placing of components 12 and 14 in recesses 26 results in a circuit construct that allows high voltage components to be constructed in a compact space, without the need for traditional component placing methods. Insulating coating 38 is applied so that the outer surface thereof is substantially planar even though a portion of insulating coating 38 fills a portion of recesses 26 and coats a portion of components 12 and 14 lying in recesses 26. Electrical assembly 10 is then electrically connected to other circuitry, not shown, by way of leads 36. In FIG. 3 only a fragmentary portion of coating 38 is shown along one edge of electrical assembly 10.

Variations and modifications of the foregoing are within the scope of the present invention. It is understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention. The claims are to be construed to include alternative embodiments to the extent permitted by the prior art.

Various features of the invention are set forth in the following claims.

What is claimed is:

1. An electrical assembly, comprising: a substantially planar dielectric single body substrate having a plurality of interlinking recesses including at least a first recess and a second recess interlinking with each other at a recess intersection; a plurality of electrical components positioned in said plurality of interlinking recesses including a first electrical component in said first recess and a second electrical component in said second recess, each of said electrical components having a body and an electrical connection, said electrical connection of said first electrical component and said electrical connection of said second electrical component each being one of a lead extending from the electrical component body and a ball of solder at an end of the electrical component body and being aligned with and electrically connected to each other within said recess intersection of said first recess and said second recess when said body of said first electrical component is in said first recess and said body of said second electrical component is in said second recess;

said substantially planar dielectric single body substrate being a field dispersing material that is readily heat conductive to form a heat sink for said first and second electrical components; and said substantially planar dielectric single body substrate having an upper surface in which said first and second recesses are formed and a reverse side opposite said upper surface, with sufficient thickness of a single material between said upper surface and said reverse side to provide said recesses with bottoms and recess depths sufficient to contain said first and second electrical components therein at or below said upper surface; wherein said electrical connection of said first electrical component is soldered to said electrical connection of said second electrical component.

2. The electrical assembly of claim 1, wherein said recesses are formed in said substrate by one of cutting and abrading.

3. The electrical assembly of claim 1, wherein each said recess is shaped to correspond with said body of said electrical component associated therewith.

4. The electrical assembly of claim 1, further comprising:
at least one conductor extending from said substrate; and
a layer of an insulating compound substantially covering said substrate and said plurality of electrical components, said layer of insulating compound covering only a portion of said at least one conductor.

5. An electrical assembly, comprising:
a single body dielectric substrate having a plurality of shaped interlinking recesses therein, said interlinking recesses forming at least one recess intersection; and a plurality of electrical components each having an external characteristic that is accommodated by being placed into a corresponding one of said plurality of shaped recesses, each of said plurality of electrical components having a body with electrical connections that are aligned by said shaped recesses to be in contact with and electrically connected to said electrical connection of at least one other of said plurality of electrical components within an intersection of interlinking recesses;
said single body dielectric substrate being a field dispersing material that is readily heat conductive to form a heat sink for said electrical components; and said single body dielectric substrate having an upper surface defining a plane in which said plurality of shaped interlinking recesses are formed, and a reverse side opposite said upper surface, with sufficient thickness of a single material between said upper surface and said reverse side to provide said plurality of recesses with bottoms and recess depths sufficient to contain said electrical components therein at or below said upper surface;
wherein said electrical connection of said first electrical component is soldered to said electrical connection of said second electrical component.

6. The electrical assembly of claim 5, further comprising an insulating compound substantially coating said substrate and said plurality of electrical components, one surface of said insulating compound defining an other plane substantially parallel to said plane.

7. The electrical assembly of claim 5, wherein said plurality of electrical components includes a plurality of diodes having bodies with leads extending therefrom and a plurality of capacitors having bodies with balls of solder on ends thereof, said leads being connected to said balls of solder within recess intersections to form a voltage multiplying circuit.

* * * * *